(12) United States Patent
Lolli et al.

(10) Patent No.: US 10,455,705 B2
(45) Date of Patent: Oct. 22, 2019

(54) APPARATUS, METHOD AND DEVICE FOR MAKING PRODUCTS INCORPORATING AN RFID

(71) Applicant: Mecstar S.r.l., Pomezia (IT)

(72) Inventors: Marcello Lolli, Pomezia (IT); Massimiliano Carlucci, Pomezia (IT); Marco Carlucci, Pomezia (IT)

(73) Assignee: Mecstar S.r.l., Pomezia (IT)

( * ) Notice: Subject to any disclaimer, the term of this patent is extended or adjusted under 35 U.S.C. 154(b) by 342 days.

(21) Appl. No.: 15/286,581

(22) Filed: Oct. 6, 2016

(65) Prior Publication Data
US 2017/0105286 A1 Apr. 13, 2017

(30) Foreign Application Priority Data

Oct. 7, 2015 (IT) ........................ 102015000059236

(51) Int. Cl.
*H05K 3/10* (2006.01)
*H05K 13/06* (2006.01)
*G06K 19/077* (2006.01)

(52) U.S. Cl.
CPC ......... *H05K 3/10* (2013.01); *G06K 19/07781* (2013.01); *H05K 13/06* (2013.01); *G06K 19/07773* (2013.01)

(58) Field of Classification Search
CPC .......... H05K 3/103; H05K 13/06; H05K 3/10; G02B 6/3612; G06K 19/07781
See application file for complete search history.

(56) References Cited

U.S. PATENT DOCUMENTS

| | | | |
|---|---|---|---|
| 3,930,524 A | * | 1/1976 | Tarbox ................... B21F 27/00 140/93 R |
| 4,031,612 A | * | 6/1977 | Nicolas .................. H05K 3/222 29/564.4 |

(Continued)

FOREIGN PATENT DOCUMENTS

| DE | 2519054 | 11/1975 |
|---|---|---|
| EP | 2284582 | 2/2011 |

(Continued)

OTHER PUBLICATIONS

Rapporto di Ricerca e Opiiiione Scritta [Search Report and Written Opinion] dated Jun. 24, 2016 From the Ministero dello Sviluppo Economico, Direzione Generale Sviluppo Produttivo e Competitivita—Ufficio Italiano Brevetti e Marchi Re. Application No. IT UB20154206.

(Continued)

*Primary Examiner* — Livius R. Cazan (57) ABSTRACT

A device configured for making a wire aerial of an element of radio frequency identification (RFID), which device comprises:
 a main body, extending along a longitudinal direction and having a longitudinal seat adapted to house a wire;
 a putting-wire head arranged at one end of the main body and constrained to the main body,
 the putting-wire head comprising:
  a guide element adapted to engage the wire and to deposit it onto a substrate, and which guide wire has a translational degree of freedom along the longitudinal direction with respect to the main body; and
  a wire-restraining element adapted to selectively abut on the guide element,
 wherein the putting-wire head is adapted to assume a first rest configuration, (Continued)

wherein the restraining element is abutted onto the guide element and the wire is retained between the restraining element and the guide element, and a second operative configuration.

11 Claims, 8 Drawing Sheets

(56) References Cited

U.S. PATENT DOCUMENTS

| | | | | |
|---|---|---|---|---|
| 4,569,716 | A * | 2/1986 | Pugh | B29C 66/1122 |
| | | | | 156/510 |
| 5,365,657 | A * | 11/1994 | Brown | B26D 7/26 |
| | | | | 156/433 |
| 5,442,848 | A * | 8/1995 | Koller | H01R 43/01 |
| | | | | 140/93 R |
| 5,783,008 | A * | 7/1998 | Belke, Jr. | B60R 16/0207 |
| | | | | 156/298 |
| 6,088,230 | A | 7/2000 | Finn et al. | |
| 6,147,662 | A | 11/2000 | Grabau et al. | |
| 2006/0205113 | A1 | 9/2006 | Oberle | |
| 2008/0125994 | A1 | 5/2008 | Schiebout | |
| 2008/0143534 | A1 * | 6/2008 | Lolli | H01Q 1/38 |
| | | | | 340/572.7 |
| 2011/0043430 | A1 | 2/2011 | Bashan et al. | |
| 2014/0268604 | A1 * | 9/2014 | Wicker | B29C 70/885 |
| | | | | 361/760 |
| 2017/0103291 | A1 | 4/2017 | Lolli et al. | |
| 2019/0114523 | A1 * | 4/2019 | Natalis | G06K 19/07718 |

FOREIGN PATENT DOCUMENTS

| | | |
|---|---|---|
| EP | 2534932 | 12/2012 |
| GB | 1461986 | 1/1977 |

OTHER PUBLICATIONS

Rapporto di Ricerca e Opinione Scritta [Search Report and Written Opinion] dated Jun. 28, 2016 From the Ministero dello Sviluppo Economico, Direzione Generale Sviluppo Produttiso e Competitivita—Ufficio Italiano Brevetti e Marchi Re. Application No. IT UB20154208.
Official Action dated May 31, 2019 From the US Patent and Trademark Office Re. U.S. Appl. No. 15/286,584. (18 Pages).

* cited by examiner

APPARATUS, METHOD AND DEVICE FOR MAKING PRODUCTS INCORPORATING AN RFID

RELATED APPLICATION

This application claims the benefit of priority of Italian Patent Application No. 102015000059236 filed Oct. 7, 2015, the contents of which are incorporated herein by reference in their entirety.

FIELD AND BACKGROUND OF THE INVENTION

The present invention relates to an apparatus and a method for making products incorporating devices or radio frequency identification elements (Radio-Frequency identifying devices, RFid).

The invention also provides a head device specifically suitable for the construction of a metal wire aerial of a RFID.

The so-called radio frequency identification devices, or RFid (Radio-Frequency Identifying devices), nowadays find a variety of applications, such as for example documents, cards or access, recognition and/or identity card.

As known, the aforementioned devices comprise an electronic storage and/or data processing element, typically a chip, connected to a data transmission aerial via radio waves.

A critical aspect of the construction of the RFid is related to the realization of the aerial and to its connection to the chip. Currently, the aerial is applied on a substrate embodying the chip by printing conductive inks, photogravure or by deposition of a copper wire.

The latter technique, on equal productivity, has the advantage of a lower environmental impact compared to the production of polyester aerials through photochemical etching, allowing a consistently higher percentage of recyclability of the RFid. In fact, it allows to use 90% of eco-friendly materials, while the polyester product is not biodegradable in any term. Moreover, the process for manufacturing of RFid on polyester is not convenient in the most of countries, due to the very stringent regulations in terms of the relative industrial waste management.

By contrast, the machines currently used for the deposition of the copper wire that realizes the aerial on its substrate are mechanically complex and generally not very versatile with respect to the possibility to vary the characteristics of the final product. Furthermore, also due to the mechanical complexity and overall dimensions and weights involved, the known machines are often not able to work within the limits of accuracy, i.e. tolerances, imposed by some types of applications, particularly those involving small substrate thicknesses and/or cross sections of the wire. These disadvantages therefore limit the application of the copper wire technology based on the deposition and, consequently, do not allow to fully benefit of the related advantages in terms of environmental impact.

SUMMARY OF THE INVENTION

The technical problem posed and solved by the present invention is therefore to provide an apparatus and a method for manufacturing RFid with metal wire aerials which allow to overcome the above mentioned drawbacks with reference to the known art.

This problem is solved by a device according to claim 1.

Preferred features of the present invention are object of the dependent claims.

According to another aspect, the invention relates to an apparatus for making products incorporating devices or radio frequency identification elements (RFid), said apparatus being configured for operating according to a continuous processing line. The invention also relates to a related method for making products incorporating radio frequency identification device.

In the present context, the acronym RFid is intended in its broadest meaning, to include any device for identification and/or storage of data based on a storage element (chip) and a relative aerial. Such a device can achieve—or be incorporated into—electronic labels, tag, transponders, documents or other.

The invention allows a continuous processing of an access title, identification and/or recognition, for example a transport card or an electronic identity card, allowing, in preferred embodiments, the obtaining of a fully finished product.

The apparatus, the method and the head device of the invention allow the realization of metal wire aerials, in particular copper, in a mechanically simple and efficient way, with high levels of accuracy.

The invention allows to operate also on supports or substrates of reduced thickness and allows to make the product produced with the copper wire competitive with respect to that one photochemical etched.

Advantageously, the apparatus and the method of the invention provide an improved motion system of a plurality of deposition wire head devices, which system allows to reduce the inertias involved, and then to make the operations faster and more reliable, enabling also to improve the accuracy of deposition and thus the compliance with the tolerances imposed.

Furthermore, the invention allows to increase the productivity, also elevating the number of the wire deposition heads that can be used simultaneously and the relative speed of the wire deposition.

As mentioned above, according to another aspect of the invention the aforementioned technical problem is solved by an apparatus for the realization of products incorporating radio frequency identification devices, which apparatus being configured for operating according to a continuous processing line which comprises, in sequence:

a supply unit of a substrate material;
an add-chip unit, having means for the application of chips on the substrate material and first reading means of each chip arranged upstream of said application means;
a unit of aerial posing, able to deposit a metal wire, preferably a copper wire, in correspondence of each chip such as to realize a corresponding radio-frequency aerial;
second reading means of each chip;
a coupling unit, adapted to place a coating material on the substrate material; and
third reading means of each chip, operating in contactless mode.

Advantageously, the apparatus can comprises downstream of said supply unit of the substrate material, heating means of the substrate material, configured for activating a thermosensitive adhesive applied on it.

Preferably, the apparatus comprises a central control unit and a database of identification data of each chip, wherein preferably said first, said second and/or said third reading means are in communication with said control unit and/or said database.

In one embodiment, the apparatus comprises alarm means, in communication with said first, said second and/or said third reading means and configured to generate an alarm signal if said reading means detects a not working chip or a chip not identified in a reference database.

Said first and/or said second reading means of each chip can comprise one or more pairs of contact elements, configured to establish a temporary connection with each chip.

Moreover, advantageously the second reading means of each chip are arranged immediately downstream of welding means of the ends of each antenna to a respective chip.

Preferably, the unit of aerial posing comprises a plurality of head devices, a relative support and a working plane on which is fed the substrate material, and wherein said support and working plane have a relative movement of translation along three mutually orthogonal axes. Said working plane can be movable according to a direction of vertical translation and said support can be movable on a horizontal plane.

The coupling unit comprises means for lengthening and/or tensioning of the coating material.

Moreover, the apparatus can comprise, downstream of said third reading means for each chip, cutting and/or die cutting means and/or rewinding means.

The invention is also related to a method of realization of products incorporating devices for radio frequency identification (RFid), which method operates according to a continuous processing line and provides, in sequence:
    the feeding of a substrate material;
    a first control reading of chips;
    an application of chips on the substrate material;
    a deposition of a metal wire, preferably a copper wire, at each chip such as to realize a corresponding radio-frequency aerial;
    a second control reading of each chip;
    a coupling of the substrate material with a coating material; and
    a third control reading of each chip.

The method can provide a control by a central control unit and a database of identification data of each chip.

Preferably, the second control reading is performed immediately downstream of a step of welding of the ends of each aerial to a respective chip.

An embodiment provides that the step of deposition of a wire employs a plurality of head devices, a relative support and a working plane on which is fed the substrate material, and wherein said support and working plane have a relative movement of translation along three mutually orthogonal axes. Preferably, the working plane is movable according to a direction of vertical translation and said support is movable on a horizontal plane.

Advantageously, said coupling provides a preliminary lengthening and/or tensioning of the coating material.

The method preferably employs an apparatus as defined above.

Other advantages, features and the operation steps of the present invention will be made evident in the following detailed description of some embodiments thereof, given by way of example and not for limitative purposes.

BRIEF DESCRIPTION OF THE SEVERAL VIEWS OF THE DRAWINGS

Reference will be made to the figures of the annexed drawings, wherein.

according to another aspect of the invention.

In the above cited FIGS. 1A and 1B the various units constituting the apparatus are represented by way of example.

DESCRIPTION OF SPECIFIC EMBODIMENTS OF THE INVENTION

Figure 1A:
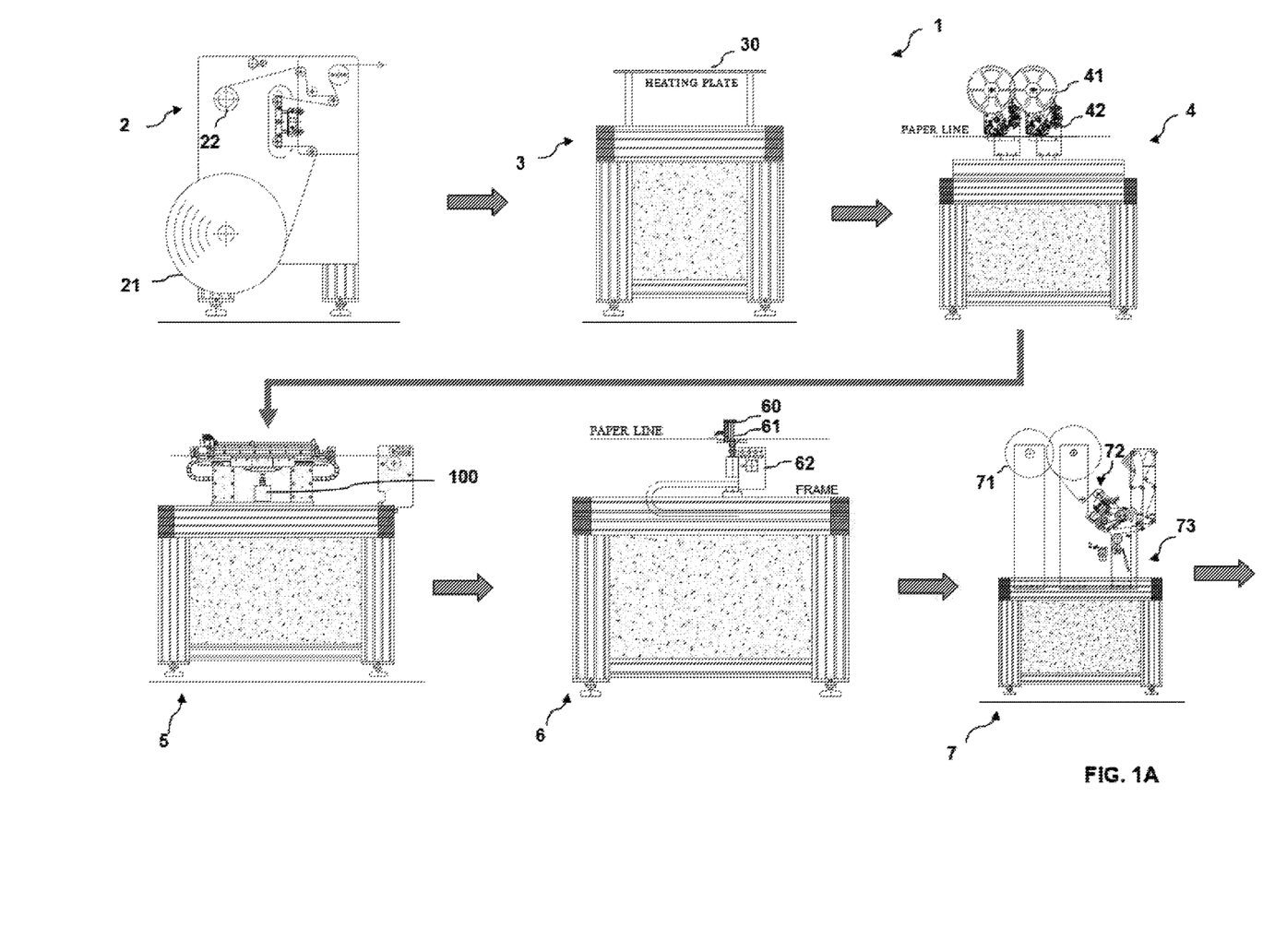
FIGS. 1A and 1B each show, in a schematic way, a respective part of an apparatus for the realization of products incorporating RFid according to a preferred embodiment of the present invention.
Figure 1B:
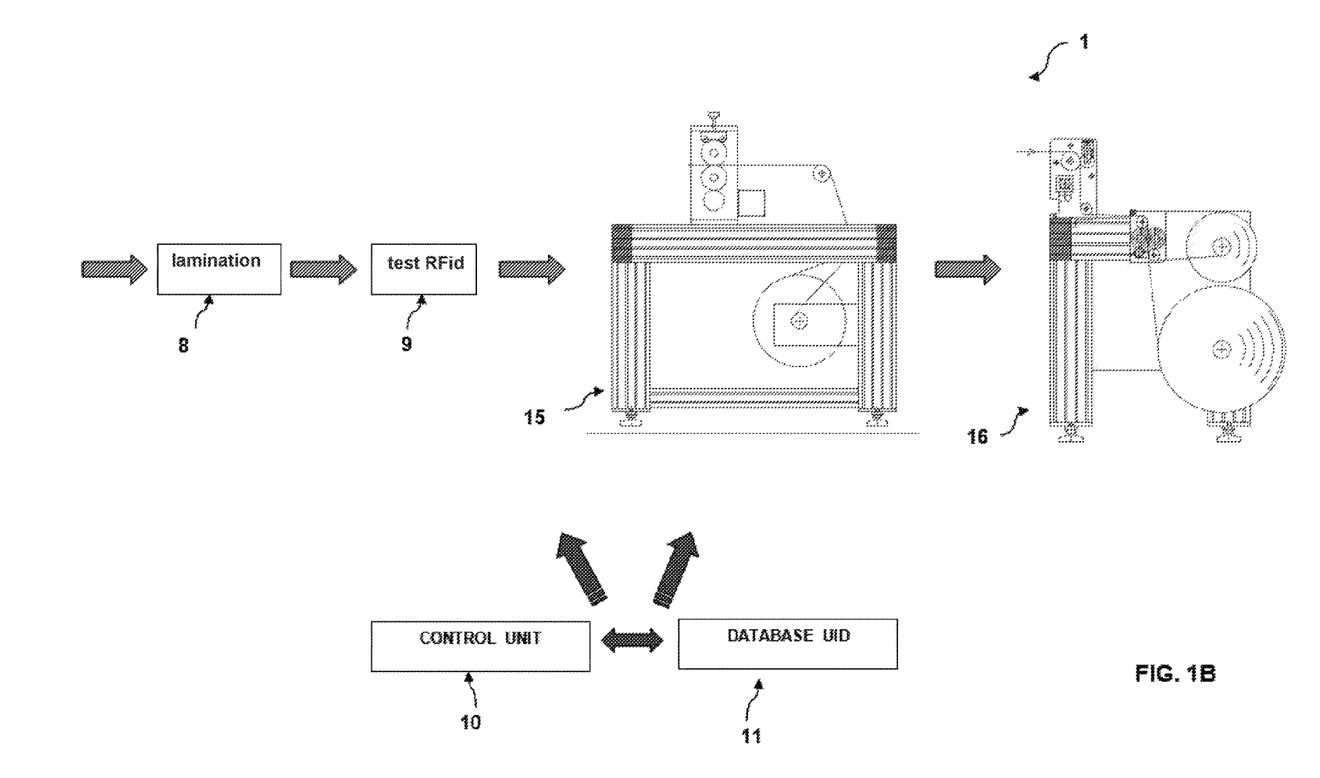

With reference initially to FIGS. 1A and 1B, an apparatus for the creation of products incorporating radio frequency identification devices (RFid), according to a preferred embodiment of the invention is overall denoted by reference 1.

The apparatus 1 realizes a continuous processing line and comprises a plurality of operative units, or stations, arranged in sequence, providing in output finished products, each incorporating a passive RFid.

The production line, in its complete configuration, may be able to realize different types of product incorporating an RFID (such as inlays, self-adhesive labels, ticket in individual formats and fanfold, tags, bracelets or other) on different support materials or substrates (for example, paper, thermal paper, PET, PVC, Polyester, or other).

The different operating units can be arranged on a base, or frame, in common.

According to advantageous embodiments, one or more units or operating means of the apparatus 1 can be mounted on tracks—or movable in another way—so as to be adjusted according to the type, the pace and number of products to obtain.

The production line made by the apparatus 1 is managed by a central control unit 10, local or remote, preferably in communication with all units, stations and/or operating means which will be described as follow. Such control unit 10 is only schematically represented in FIG. 1B.

Advantageously, the production line may incorporate sensors or transducers, in particular one or more photocells, in communication with the central control unit 10 and suitable to monitor the positioning of the different units, the progression of basic materials and/or semi-finished products on the line and/or other parameters.

Advantageously, each chip is associated with an identifying data (User Identifier, UID), and such data, for all chips, are stored in a local or remote reference database, schematically shown only in FIG. 1B and therein denoted with reference 11.

According to a preferred embodiment, the production line starts from a supporting material, or substrate, on which apply chip and respective aerials, which substrate bears codes or pre-printed control elements, or pre-applied. The latter, read in correspondence of the various units or operating means of the apparatus 1, allow to perform the machining operations—and in particular the deposition of chips and aerials—in predetermined positions. Such reading of the codes or control elements along the line can be performed by means of sensors or transducers, for example photocells.

In the present embodiment, the apparatus 1 comprises first of all an unwinder unit 2, which performs a power supply unit of the supporting material, or substrate. According to a specific implementation, such an unwinder unit 2 comprises a motorized unwinder 21 for unwinding coils of substrate. In a variant embodiment, is also provided a rewinder 22 of a film, or liner, of the substrate coating, which is separated from the substrate precisely at the level of the unit 2.

Preferably, upstream or downstream of the unwinder unit 2 are provided applying means of an adhesive on the same substrate material. Preferably, this adhesive is of the thermosensitive type, for example the so-called "Hot Melt". The substrate can also be provided directly in the form of coil arranged with a deposition of said adhesive.

In the present embodiment, the presence of the adhesive on the substrate is functional (also) to the following reception of the wire that realizes the aerial.

The apparatus 1 further comprises a heating assembly 3, in particular of induction type and for example incorporating a heating plate 30.

This heating assembly 3 is particularly suitable in case of products with a transmitting aerials by high frequency (HF) and cannot be installed in the case in which are exclusively realized products in "Ultra-High-Frequency" (UHF).

In the assembly 3, the substrate is radiated by the heat of the plate 30, softening and allowing the operations referred to the further steps.

Typically, the "Hot Melt" adhesive mentioned above is a dry adhesive which tempers and becomes adhesive around a temperature ranging from 80° C. to 120° C. Preferably, it is possible to adjust the temperature of the plate 30 as a function of the temperature required to tempering the applied adhesive.

The apparatus 1 therefore comprises an assembly, or unit, add-modules, or add-chip, 4.

Such add-chip unit 4 is configured to handle, cut, and deposit on the substrate material a semi-finished coil called "strap", on which are mounted or embedded chips. Each "strap" bears a chip and associated end contacts for the connection to the respective aerial and operates in high frequency (High Frequency, HF)

The add-chip unit 4 is configured to simultaneously deposit a plurality of chip on the substrate material.

The add-chip unit 4 firstly comprises chip application means 41 on the substrate material, based on mechanical components which movement can be finely controlled.

The add-chip unit 4 further comprises first reading means 42 of each chip, which are arranged upstream of the means 41 just mentioned. The reading means 42 allow a control/checking of pieces (chip), preferably on the basis of a comparison with the identification data (UID) of each chip stored in the reference database 11.

Therefore, the add-chip unit 4 is configured to perform the reading of each chip before the creation of the relative aerial. According to a preferred embodiment, such a reading is carried out during a step of advancement of the chip in the coil, through the ends of the strap, using external contacts—for example, copper wires—which are in turn connected to a reference aerial. This aerial is positioned in correspondence of a reader and the reading is carried out by the temporary connection with the chip which realizes a closed circuit. Such connection, in the given example, may involve physical contact.

Other embodiments may provide a configuration with a contactless type connection. In particular, the apparatus of the invention may start from a semi-finished product different from the aforementioned strap, for example the so-called "loopetti", and in general elements that operate in the UHF (Ultra High Frequency). In this case, each element ("loopetto" or other) is not made resonant through a further circuit, but directly read by a microreader provided on the add-chip unit.

The above described system allows to generate a dedicated database for controlling the chip, and/or to update the aforementioned database 11, indicating the chip perfectly connected to the straps and operating and those ones damaged or deteriorated (for example during the storing phase in coils) before the same chip are in turn processed in the following units.

Therefore, the apparatus 1 is able to highlight the trends and the yield in a very early stage of the production.

Any defects detected by the control unit 10 with respect to the parameters provided for the production allow the immediate stop of the line with the operator alert.

Other embodiments may provide for the creation of a database dedicated to the chip codes independently by the presence or not of the central database 11. Furthermore, this dedicated database can be created at the time of the aforementioned reading step or upstream, before the entrance of the semi-finished coil in the production cycle.

The apparatus 1 further comprises an aerial-making assembly including a unit, or group, of aerial posing 5, adapted to deposit a metal wire, a copper wire in this case, in correspondence of each chip so as to realize a corresponding radio-frequency aerial.

By way of example, the wire may be suitable for the construction of UHF aerials and have a thickness of about 70-100 micron, in particular about 80 micron.

Figure 4:
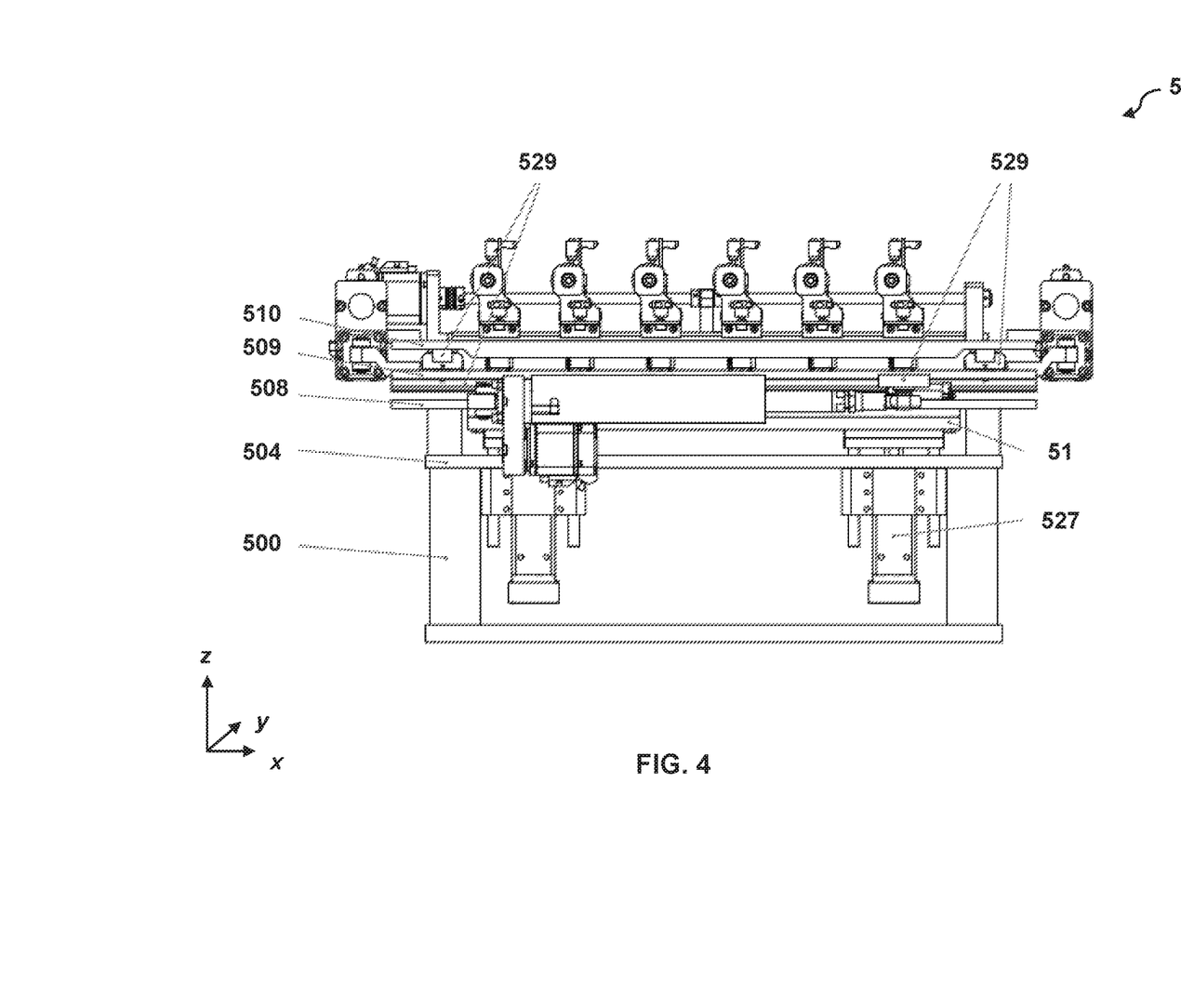
FIG. 4, 4A and 4B show a preferred embodiment of a unit of aerial posing of the apparatus of FIGS. 1A and 1B, respectively in side view, in top plan and cross-sectional plan.
Figure 4A:
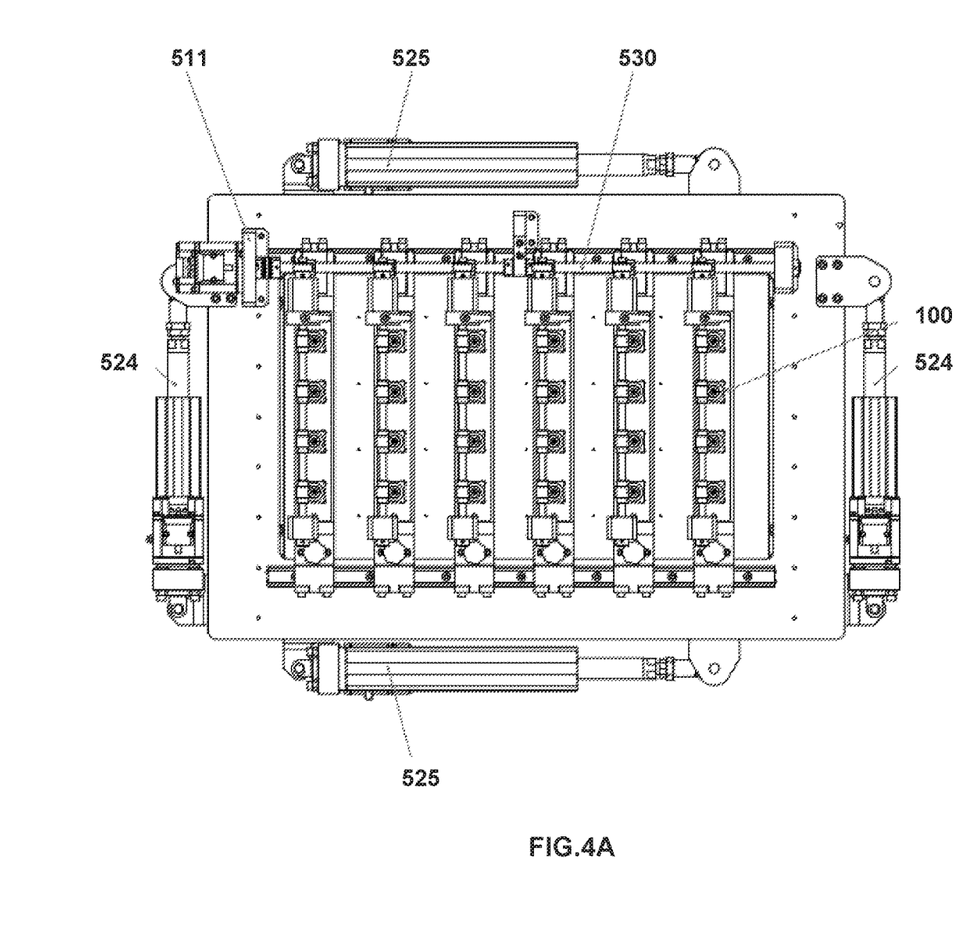

As more detailed shown in FIGS. 4 and 4A, advantageously the unit of aerial posing 5 comprises a plurality of head devices for the deposition of the wire, each denoted with the reference 100. The heads are divided, in the example represented, in six groups. In the present example, each group is formed by four heads and bears a common support 50, in particular in the form of a bar.

The support 50 of the heads and the working plane on which the substrate material embodying the chip is fed, herein denoted with 51, have a translational relative motion according to the three mutually orthogonal axes x, y and z represented in FIG. 4. In particular, the z-axis is a vertical axis while the two axes x and y are horizontal and define the working plane. More specifically, the x-axis extends in the advancing direction of the semi-finished product along the working line.

Advantageously, the vertical translational motion (z-axis) is conferred to the working plane 51, while the motion on the horizontal plane (x and y axes) is conferred to the supports 50.

The above mentioned translational motions can be obtained by means of linear motors of the known type, preferably controlled by the central control unit 10.

Going further into detail, in the embodiment represented the unit 5 comprises a base 500.

As already mentioned, the unit 5 can be mounted on two rails that allow it to be put in register according to the pace and the number of aerials to be obtained. The production pace may be controlled by optical fiber photocell.

Over the aerials plane, for example about 1 m above it, there is provided a mechanical structure, such as for example a "spool type chassy" or other similar device known in the field, for housing the copper coils needed to the production.

In FIG. 4 is represented a fixed plane 508, a lifting actuators supporting plane, or plate, 504, a movable plane 509 in the x-direction and a movable plane 510 in the y-direction. All four of these plans can also be made in the form of frames, through which passes a fifth full lifting plan, or pushing plate, even this denoted by 51.

In the present example, the lifting plane 51 rests on four vertical motorized actuators 527 that are mounted on the actuators supporting plane 504. The actuators 527 push the lifting plane 51 up and down, through the other planes, bringing it in contrast with the heads 100 mounted on the last movable plane 510.

The movable plane 509 is placed above the fixed surface 508 for example through a system of two dovetail carts 529, the latter powered by two motorized actuators 525, as can be seen in FIG. 4A. The carts 529 allow the longitudinal sliding to the support (the x-direction). Preferably, the movable plane 510 in turn is placed above the movable plane 509 through an analog system of dovetail carts 529, that in this case are mounted on the short side, and thus, fed by motorized actuators 524, allow the sliding of the plane 510 in the transverse direction (y) to the support.

The elements which connect this structure with the putting-wire heads 150 are further described.

Figure 4B:
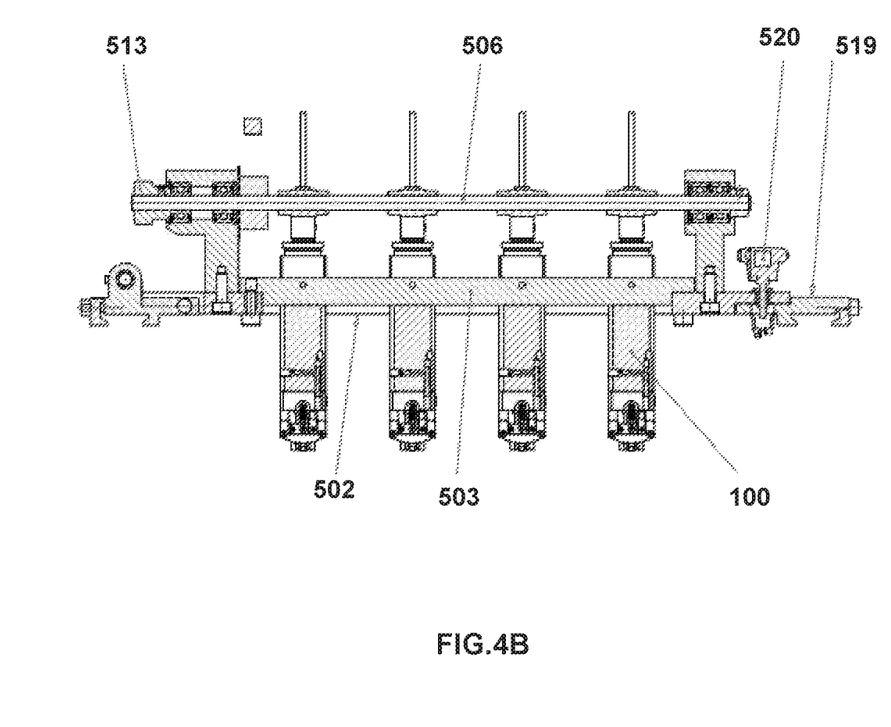

FIG. 4B shows the overall detail of a tipper frame 502 and of a holding heads frame 503 according to a preferred embodiment of the invention. The tipper frame 502 and the holding heads frame 503 are mounted transversely over the last movable plane 510 and allow the insertion of the heads and their arrangement on a particular layout. This system allows a very fast layout changes.

The frame 502 is secured to the movable plane 510 by means of two shoe type guides 519, sliding and fixable, which allow the positioning of the groups of heads simply by loosening fastening screws 520 and moving the groups along these guides. This mechanism allows the changing of the longitudinal pace. For the quick change of the transverse pace, namely the interaxle spacing between the heads, it is necessary to replace the holding heads frame 503 that houses, in the square seat, the head body that is quickly inserted from below and stuck with a precise fastening for example through a grain in abutment or by means of an adjusting screw, preferably to obtain an adjustable fixing.

Each head group takes a rotary motion from a main group of head transmission 511, which comprises a main transmission axis 530 along the entire long side of the movable plane 510. From the coupling of this axis with a transmission shaft 506 of the tipper frame 502, for example through a single portal gear 513, a rotary motion is transmitted to each of the heads 100.

The specific construction of each head device 100 and the relative ways of handling are further explained with reference to FIGS. 2, 3A, 3B and 3C.

The aerial making assembly also comprises a unit, or group, of electrical connection, configured for electrically connecting the metal wire with a respective chip.

With reference to the embodiment shown in FIG. 1A, the electrical connection unit is a unit of welding 6. Such group complete the creation phase of each RFid, by carrying out the welding of the copper wire on the end contacts of the respective strap.

According to a preferred embodiment, the unit 6 bears sealing means 61 mounted on a movable traverse 60, suitable to come in contact with a working plane on which slides the semi-finished product obtained upstream of the unit 6 itself.

Advantageously, the apparatus 1 comprises, in this unit 6 or in association with it, second reading means 62 of each chip, for the simultaneous reading, and thus control, of the aerial realized.

It can also be provided writing means, for customizing the content of each chip. Such writing can consist of a simple formatting of the fields or even in a real data entry.

Both the reading means that the writing means just mentioned can be in communication with the database 11 and/or with the control unit 10 already mentioned.

The first and/or the second reading means 42 and 62 may comprise one or more pairs of engagement or contact elements, configured to establish a temporary connection with each chip. As already mentioned, the reading can be performed in a contactless mode.

The apparatus 1 further comprises a coupling unit 7, or group, adapted to provide a coating material to the semifinished product, so as to obtain a multilayer product. The coating material can be pre-printed with specific information peculiar to the product that is obtaining.

According to a specific implementation, the unit 7 comprises one or more motorized unwinders 71, possibly associated to a rewinder of protective elements provided on the coating material (for example a so called liner or a film in the case of self-adhesive coating material). Advantageously, the unit 7 also comprises means 72 for tensioning/stretching of the coating material, operating upstream of feeding means 73 of the coating material to the semifinished product. Said tensioning/stretching ensures a better adhesion of the coating material.

With reference to FIG. 1B, preferably the apparatus 1 then comprises a laminating unit, or group, 8. According to a specific implementation, the unit 8 realizes a system for the hot rolling of the coupled materials, for example in the case of "hot melt" adhesive applied on one or both of such materials. The laminating unit 8 may comprises a pair of heating plates, selectively attestable one on the other by means of suitable moving means.

The apparatus 1 then comprises a test group 9 for the RFid obtained from the previous processing. This group 9 realizes third reading means of each chip, in this case operating in contactless mode, and in communication with the database 11 and/or the control unit 10 mentioned above.

According to a specific implementation, the group 9 comprises a plurality of readers mounted on a mask, for example made of brass, placed facing on, or "flush" with, the semi-finished product, which allows the reading without interference of realized RFid aerials.

The performed reading is compared with the database formed by or updated with the previous readings, in particular during the welding step through the second means 62.

Preferably, the apparatus 1 further comprises a cutting and/or die-cutting group, or unit, 15. According to a specific implementation, such unit 15 comprises a rotary die, for example actuated by a stepper motor. The unit 15 may also comprises knives for longitudinal cut and/or cut-sheets.

Finally, the apparatus 1 may comprises a rewinder unit 16, in case the products are not individually separated in the previous cutting and/or die-cutting unit 15.

Advantageously, the apparatus 1 may comprises alarm means, in communication (directly or through the control unit 10) with the first, second and/or third reading means 42, 62 and 9 and configured to generate an alarm signal in the case of the reading means detect a not working or not identified chip in the reference database 11.

Figure 2:
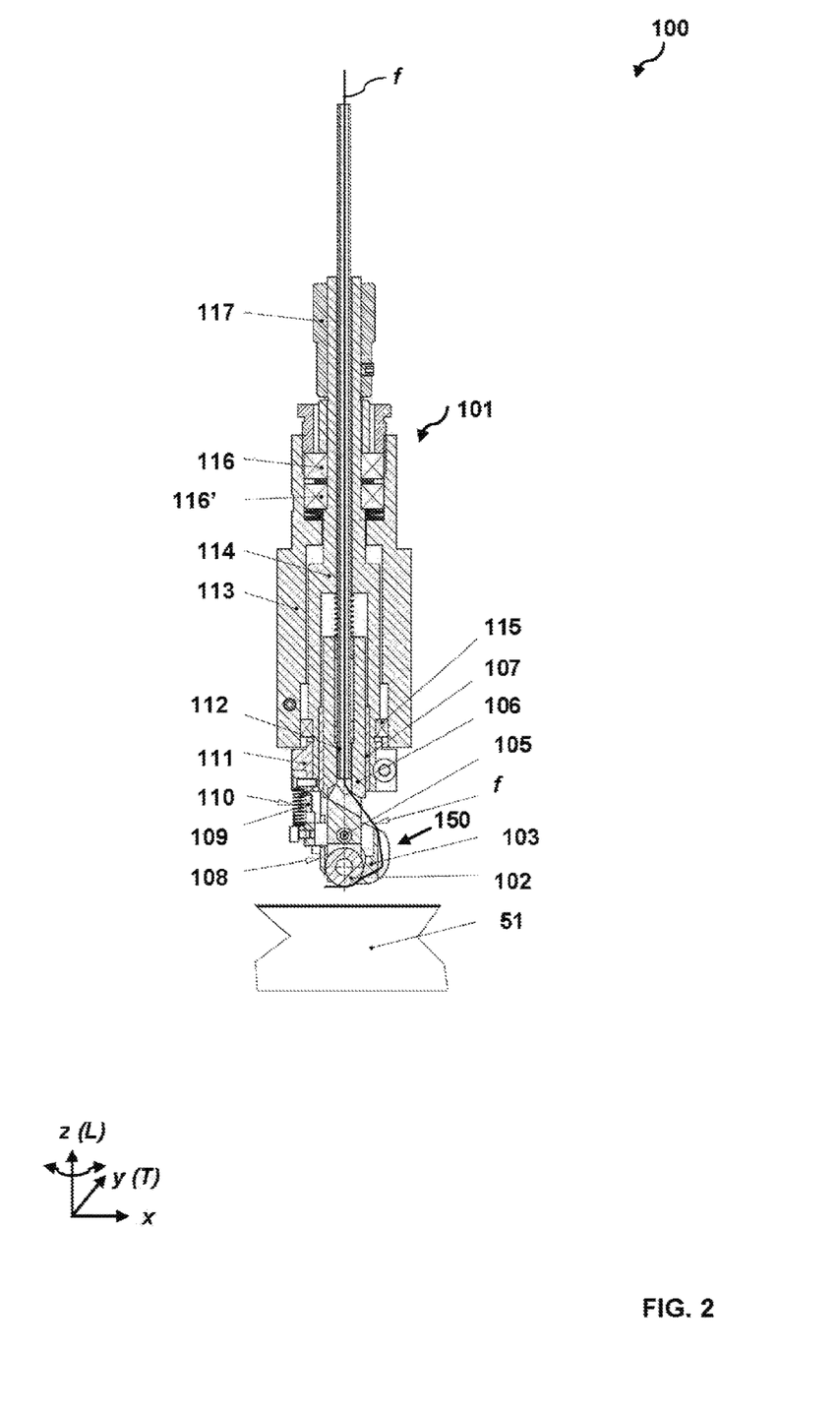
FIG. 2 shows a view in longitudinal section of a head device for the deposition of a wire-aerial on a substrate, which device is performed according to a preferred embodiment of the invention and is preferably comprised in the apparatus of FIG. 1A.

Now referring to FIGS. 2 and from 3A to 3C, it will be described more in depth a preferred embodiment of each head device 100 in the aerial posing unit 5 introduced above.

The device 100 is shown as cooperating with the working plane 51, the latter obtained on the vertically movable base 51.

As stated above, each device 100, which for the sake of simplicity will be called head, is configured for the realization of a wire aerial of a radio frequency identification device (RFid).

The head 100 firstly comprises a main body 101 extending along a longitudinal direction L which corresponds to the vertical axis z. The main body 101 is adapted to be secured to the common support 50 already mentioned above. The main body 101 has a longitudinal housing, or channel, 112 which, in use, slidably houses the wire, herein denoted by f, which realizes the aerial.

The wire that passes through the channel 112 comes out from a small hole located in the proximity of a lower portion of the device 100 that realizes a putting-wire head 150.

The putting-wire head 150 is precisely arranged at a (bottom) end of the main body 101 and constrained to the latter so as to have a translational degree of freedom in the longitudinal direction L.

The putting-wire head 150 in turn comprises a guide element 102, preferably rotatable according to an axis parallel to the longitudinal direction L. The element 102 is in the form of a bearing, or rotary element, with a circular or spherical geometry. In use, it engages and guides the wire to deposit it on the substrate fed on the working plane 51.

The head 150 also comprises a restraining element 103 of the wire, preferably shaped like a beak, adapted to selectively abut on the guide element 102.

The beak-like element 103 is rotatable, in particular tilting, relative to the guide element 102 according to a transverse axis of rotation T perpendicular to the longitudinal direction L and corresponding to the y-direction.

The components of the device 100 introduced so far will now be described in a more detailed way.

The main body 101 is formed by an outer body 113 that internally receives a central shaft 114, in turn internally housing a bearing holder pin 106 constrained to the beak-like element 103 through a plug 105. Such connection allows the aforementioned tilting motion of the beak-like element 103 relative to the guide element 102.

The guide element 102 is rotatably coupled to the bearing holder pin 106 by means of a further plug 155 or an equivalent element.

The bearing holder pin 106 can be replaced with an alternative supporting means. The three bodies 113, 114 and 106 each have a substantially cylindrical geometry and, as mentioned, are housed one inside the other.

The outer body 113 constrains the head 100 to the common support 50 and operates the translational movement on the horizontal plane (x and y axes).

In turn, the outer body 113 is constrained to the central shaft 114 through three levels of bearings 15, 16 and 16', or equivalent means, which allow the rotation of the second one inside the first one around the z axis.

The central shaft 114 projects beyond the outer body 113 and is equipped with a gear 117 mounted on its end, suitable to allow an idler rotation.

In a specific implementation, the rotational movement of the shaft 114 is carried by magnetic gears placed on two axes at 90° and driven by a stepper motor controlled, for example, by a Programmable Logic Controller (PLC). Different embodiments may require the use of conventional gear of the contact type or other transmission means of motion.

The bearing holder pin 106 is coupled to the central body 114 through a bushing 107, or equivalent means, and integral with it with respect to rotations around the z axis. The bearing holder pin 106, and with it the guide element 102 and the beak-like element 103, is slidably coupled, vertically along the z axis, in the seat formed in correspondence of the bushing 107. As will be soon explained, this sliding allows to favor the movements of the working plane 51 and thus to trigger the retaining or releasing function of the wire f by the beak-like element 103.

The head 100 also comprises a blade 108 arranged side by side to the guide element 102, on the opposite side of the beak-like element 103. The blade 108 is mounted on a blade-carrying clamp 111, or on a similar supporting element, in turn constrained on the central shaft 114 and rotatably integral with it.

The device 100, and in particular its head 150, can assume three main configurations, as described below.

Figure 3A:
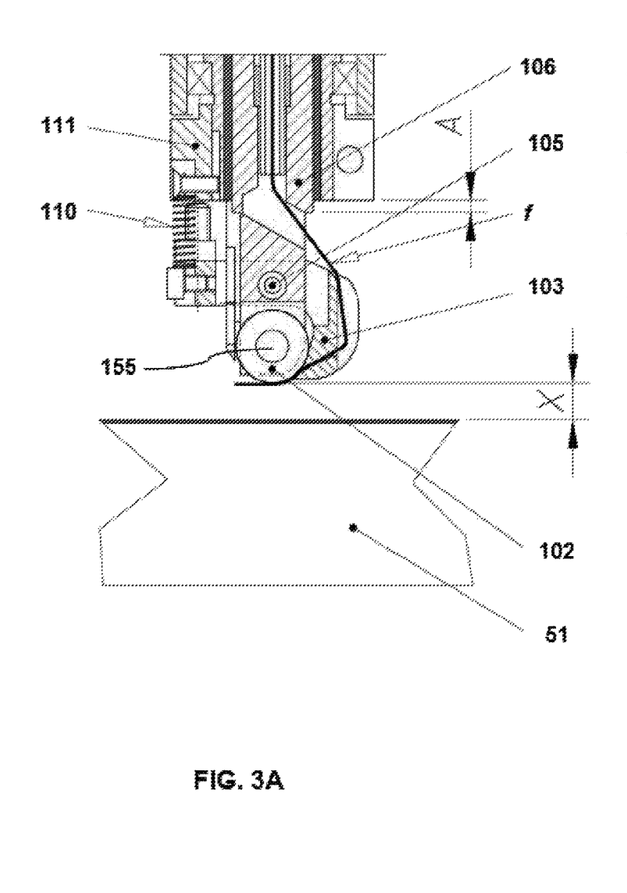
FIGS. 3A, 3B and 3C each show a partial view in longitudinal section of the head device of FIG. 2, in a respective operative configuration.

In a first rest configuration, shown in FIG. 3A, the working plane 51 is under the height of guide element 102 of an X quantity, and the beak-like element 103 remains closed restraining the copper wire f pressed against the element 102, as in a vise.

In particular, the beak-like element 103 mounted on the bearing holder pin 106 would be free to tilt, namely to swinging around the axis T, but is held closed by the action of a spring 110 or by an equivalent biasing, means. The latter presses an inner engagement surface of the beak-like element 103 against the element 102.

Figure 3B:
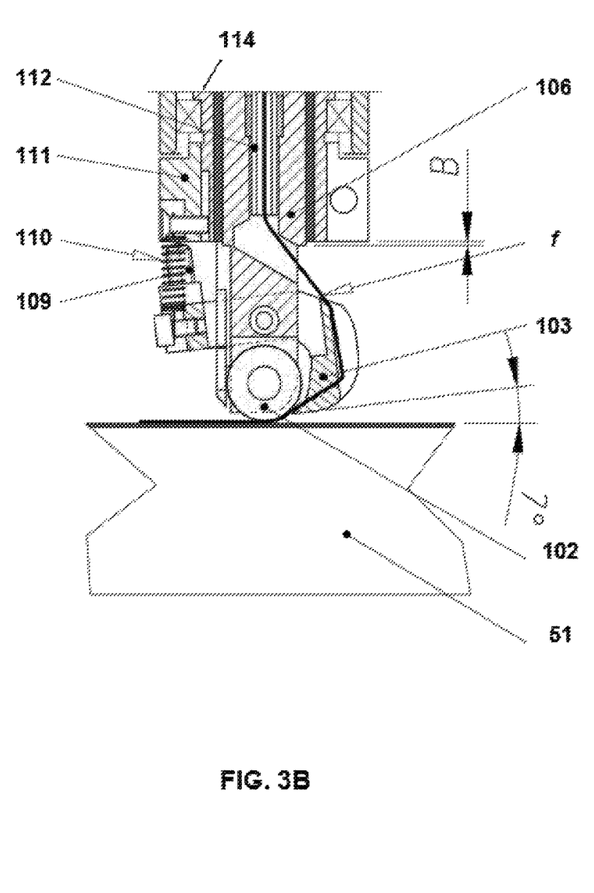

In a second operating configuration of the wire deposing on the substrate, shown in FIG. 3B, the working plane 51 height rises up to come in touch with the guide element 102. From this point onwards any further displacement of the plane 51 toward upwards pushes, equally, the bearing holder pin 106 in its seat inside the central shaft 114.

Contextually to the upward rising of the bearing holder pin 106, a contrast hex key 109 has a pushing effect against the blade-carrying clamp 111 which, being mounted on the central shaft 114, keeps the starting height.

This thrust determines the opposite effect to that one performed by the spring 110, namely it opens the beak-like element 103, moving it away from the element 102. The contrast between the two actions is obviously won by the hex key 109 that has no elasticity.

This aperture makes free the copper wire f from the grip formed by the elements 102 and 103, leaving it free to slide and then to be released on the substrate during the path described by the head 150.

The sliding plane 51 remains at this height for all the time of deposition of the wire f.

During the deposition, the head 102 rolls on itself (i.e. around the z axis), thus allowing the deposition of the wire according (even also) to a curvilinear path.

In summary, therefore, the overall arrangement is such that the putting-wire head 150 is adapted to assume a first rest configuration, wherein the beak-like element 103 is attested on the rotary element 102 and the wire is retained between theme, and a second operating configuration, wherein the beak-like element 103 is spaced from the rotary element 102 in such a way that the wire can slide within said seat 112 and be deposed on the substrate by means of the rotary element 102.

Figure 3C:
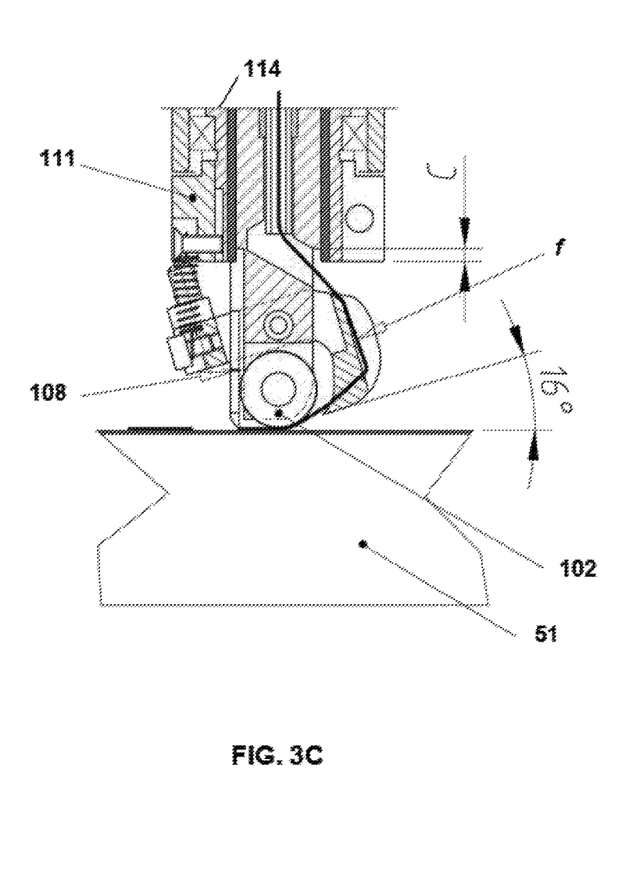

Starting from the height used during the deposition, once the description of the path that forms the aerials is completed, the lifting plane 51 makes a further rising to such a height that meet the blade 108 and carrying the device 100 in a different operative cutting wire configuration, shown in FIG. 3C.

Attained this height, the blade 108 chops off the wire and the working plane 51 makes a descent that will bring him back to the starting height and, consequently, the head device 100 in the rest configuration.

In some embodiments, the head device or each head device may comprise a micrometric adjustment means, for example a ring nut, to allow a register setting of a plurality of head devices by means of a handling, typically vertical, of the guide element 102 and/or the blade 108.

The present invention has hereto been described with reference to preferred embodiments. It is to be understood that there may be other embodiments afferent to the same inventive concept, as defined by the scope of protection of the claims set out below.

What is claimed is:

1. A device configured for making a wire aerial of an element of radio frequency identification (RFID), which device comprises:
    a main body, extending along a longitudinal direction and adapted to be constrained to a support, which main body has a longitudinal seat adapted to house a wire for making the aerial;
    a putting-wire head arranged at one end of said main body and constrained to said main body,
    said putting-wire head comprising:
        a guide element, which guide element is adapted to engage the wire and to deposit it onto a substrate, and which guide wire has a translational degree of freedom along said longitudinal direction with respect to said main body; and
        a wire-restraining element, adapted to selectively abut on said guide element,
    the overall arrangement being such that said putting-wire head is adapted to assume a first rest configuration, wherein said restraining element is abutted onto said guide element and the wire is retained between said restraining element and said guide element, and a second operative configuration, wherein said restraining element is spaced apart from said guide element in such a way that the wire slides within said longitudinal seat and is deposed onto the substrate by means of said guide element.

2. The device according to claim 1, wherein said restraining element is rotatably coupled, directly or indirectly, to said guide element.

3. The device according to claim 2, wherein said restraining element is rotatable according to a transverse axis of rotation perpendicular to said longitudinal direction.

4. The device according to claim 1, comprising an elastic biasing element configured to maintain said restraining element in said rest configuration of the putting-wire head.

5. The device according to claim 1, in which said guide element has a circular geometry, such as to be able to roll on the substrate.

6. The device according to claim 1, comprising cutting means of the wire arranged side by side to said guide element.

7. The device according to claim 6, in which the overall configuration is such that a retraction of said guide element in longitudinal direction determines the contact of said cutting means with the thread deposited on the substrate.

8. The device according to claim 1, comprising elastic biasing means for retaining said guide element in a position longitudinally advanced or projecting from said main body.

9. The device according to claim 1, wherein said guide element is rotatable according to an axis parallel to said longitudinal direction.

10. The device according to claim 1, wherein said wire-restraining element is shaped like a beak.

11. An apparatus for making products incorporating devices for radio frequency identification (RFID), which apparatus comprises a device according to claim 1 and a working plane movable with respect to the latter device along said longitudinal direction, the latter longitudinal direction being a vertical direction, in which the overall configuration is such that a translation of said working plane towards said device determines the abutment on said guide element and the retraction of the latter guide element toward said main body.

* * * * *